United States Patent
LiCausi et al.

(10) Patent No.: US 10,134,580 B1
(45) Date of Patent: Nov. 20, 2018

(54) METALLIZATION LEVELS AND METHODS OF MAKING THEREOF

(71) Applicant: GLOBALFOUNDRIES Inc., Grand Cayman (KY)

(72) Inventors: Nicholas V. LiCausi, Watervliet, NY (US); Errol Todd Ryan, Clifton Park, NY (US); Sean Xuan Lin, Watervliet, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 15/677,693

(22) Filed: Aug. 15, 2017

(51) Int. Cl.
| | |
|---|---|
| *H01L 21/02* | (2006.01) |
| *H01L 21/48* | (2006.01) |
| *H01L 21/3213* | (2006.01) |
| *H01L 23/522* | (2006.01) |
| *H01L 21/768* | (2006.01) |
| *H01L 23/532* | (2006.01) |

(52) U.S. Cl.
CPC .... *H01L 21/02167* (2013.01); *H01L 21/3213* (2013.01); *H01L 21/4846* (2013.01); *H01L 21/76801* (2013.01); *H01L 21/76816* (2013.01); *H01L 21/76837* (2013.01); *H01L 21/76877* (2013.01); *H01L 23/5226* (2013.01); *H01L 23/5329* (2013.01)

(58) Field of Classification Search
CPC ........... H01L 21/4846; H01L 21/02167; H01L 21/3213; H01L 21/76801; H01L 21/76816; H01L 21/76837; H01L 23/5226; H01L 23/5329
See application file for complete search history.

(56) References Cited

U.S. PATENT DOCUMENTS

| | | | | |
|---|---|---|---|---|
| 5,946,600 | A  * | 8/1999 | Hurwitz | H01L 21/4846 257/E21.589 |
| 9,972,589 | B1 * | 5/2018 | Goh | H01L 23/66 |
| 2006/0281298 | A1 * | 12/2006 | Noguchi | H01L 21/76811 438/622 |
| 2008/0157380 | A1 * | 7/2008 | Hong | H01L 21/76849 257/751 |
| 2014/0162176 | A1 * | 6/2014 | Ning | G03F 1/28 430/5 |
| 2016/0190009 | A1 | 6/2016 | Wallace et al. | |

* cited by examiner

*Primary Examiner* — Fei Fei Yeung Lopez
(74) *Attorney, Agent, or Firm* — Thompson Hine LLP; Anthony Canale (57) ABSTRACT

Structures for metallization levels of integrated circuits and associated fabrication methods. A first metallization level with a metallization line is formed. A second metallization level is formed over the first metallization level, having two metallization lines and two conductive vias extending from the two metallization lines to the metallization line in the first metallization level. The first metallization line is separated into a first section and a second section disconnected from the first section, so that the first section is connected by one conductive via to one metallization line in the second metallization level, and the second section is connected by the other conductive via to the other metallization line in the second level.

17 Claims, 9 Drawing Sheets

METALLIZATION LEVELS AND METHODS OF MAKING THEREOF

BACKGROUND

The present invention relates to semiconductor device fabrication and integrated circuits and, more specifically, to metallization levels for integrated circuits and methods of fabricating metallization levels.

Metallization levels or layers of an integrated circuit provide connections between devices and components of the integrated circuits. Any one metallization level generally includes multiple conductive metallization lines, and metallization lines of one level may be connected by conductive vias to metallization lines of a higher or lower level. As integrated circuit devices continue to shrink, limitations of various fabrication techniques may restrict where conductive vias may be placed as well as how closely conductive vias may be placed together, restricting designs for particular metallization levels as well as the overall integrated circuit.

SUMMARY

In an embodiment of the invention, a method includes forming a first metallization level and second metallization level over the first metallization level. The first metallization level has a metallization line, and the second metallization line has a dielectric layer and two metallization lines connected, by conductive vias extending through the dielectric layer, to the metallization line in the first metallization level. After the second metallization level is formed, the metallization line in the first level is separated into two sections disconnected from one another, resulting in one section being connected to one metallization line in the second level by one conductive via, and the other section being connected to the other metallization line in the second level by the other conductive via.

In an embodiment of the invention, a structure has a first metallization level with a metallization line separated into two sections disconnected from one another. The structure has a second metallization level over the first metallization level, and the second level has a dielectric layer, one metallization line connected to one section in the first level by one conductive via extending through the dielectric layer, and another metallization line connected to the other section in the first level by another conductive via extending through the dielectric layer. The one section of the metallization line in the first metallization level has an end aligned with and contacting a sidewall of the one conductive via, while the other section of the metallization line in the first metallization level has an end aligned with and contacting a sidewall of the other conductive via.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

DETAILED DESCRIPTION

Figure 1A:
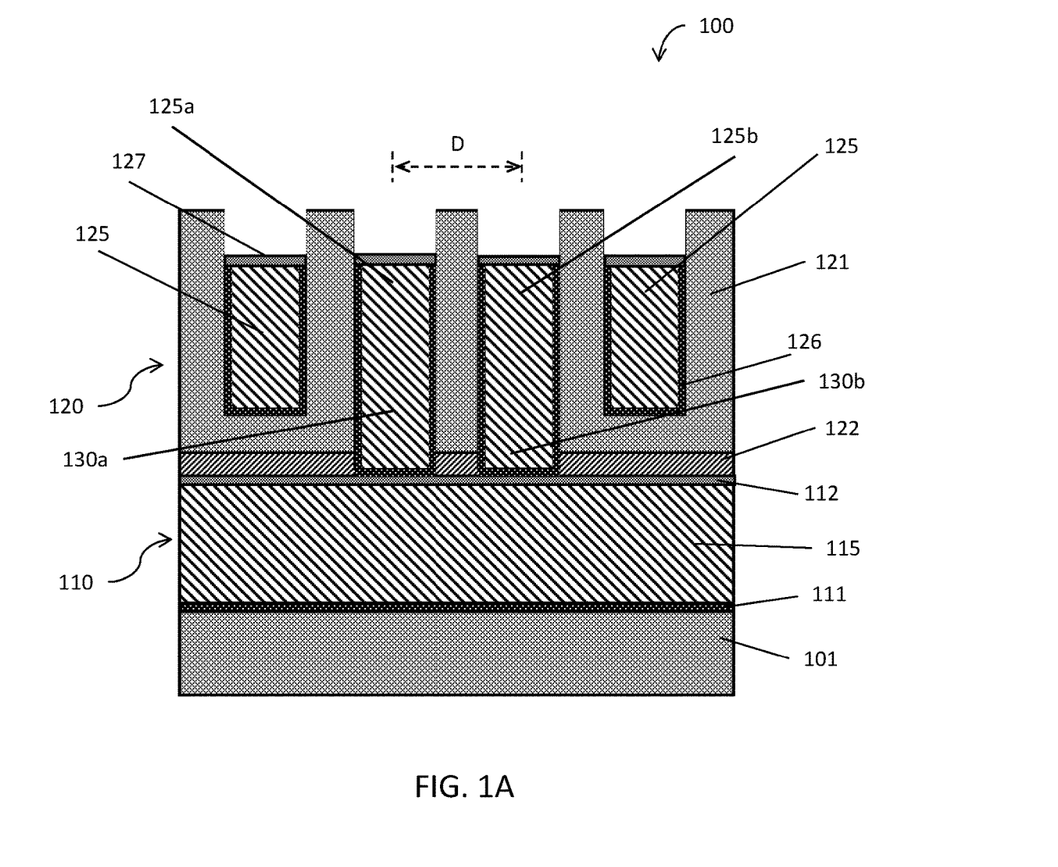
FIGS. 1A and 2-9 are cross-sectional views of a structure at successive fabrication stages of a processing method in accordance with embodiments of the invention.
Figure 1B:
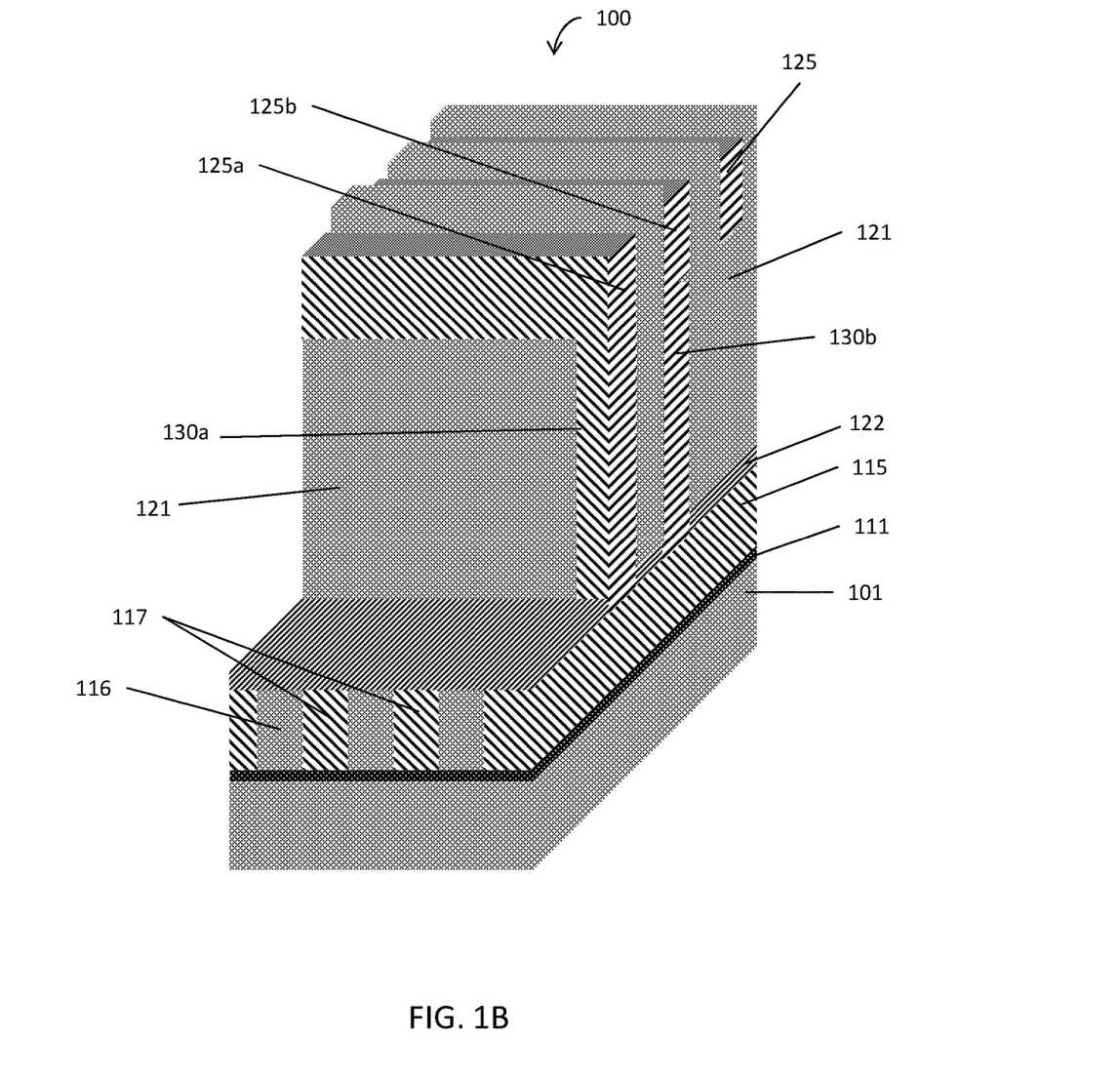
FIG. 1B is an isometric view of the structure depicted in FIG. 1A.

With reference to FIGS. 1A and 1B and in accordance with embodiments of the invention, a structure 100 is depicted following formation of a first metallization level 110 and a second metallization level 120 over first metallization level 110. In FIG. 1B, a portion of structure 100, including a portion of dielectric layer 121 and a metallization line 125, has been removed for clarity and ease of understanding. First metallization level 110 has a metallization line 115, and may have additional metallization lines 117 and a dielectric material 116 disposed between the metallization lines 115, 117 as shown in the isometric view of structure 100 in FIG. 1B. First metallization level 110 may be disposed over an interlayer dielectric layer 101, which may electrically isolate the metallization level from underlying circuit structure components or another metallization level (not shown in FIGS. 1A-9). Structure 100 also has a second metallization level 120 that has a dielectric layer 121, a metallization line 125a, and another metallization line 125b, and may include additional metallization lines 125. Second metallization level 120 also has a conductive via 130a extending from metallization line 125a through dielectric layer 121 to metallization line 115, and another conductive via 130b extending from metallization line 125b through dielectric layer 121 to metallization line 115. Structure 100 may also include a dielectric cap 122 disposed over first metallization level 110 and below dielectric layer 121. Dielectric cap 122 may be a different dielectric material than the dielectric material of dielectric layer 121, and may have a different etch selectivity from the dielectric layer 121. For example, dielectric layer 121 may be an oxide dielectric material and dielectric cap 122 may be a nitride dielectric material. Herein, the terms "first" and "second" are used in connection with different metallization levels to denote the relative positions of the metallization levels within structure 100 for ease of reference, and not by way of limitation. A "first metallization level" such as metallization level 110 in FIGS. 1A-1B may correspond to a first or lowest metallization level in an integrated circuit structure, or may correspond to a higher metallization level in said structure; similarly, a "second metallization level" such as metallization level 120 may correspond to a second metallization level formed over the first metallization level, or may correspond to a higher metallization level in the integrated circuit structure.

A metallization level of an integrated circuit structure, whether first metallization level 110 or second metallization level 120 or another metallization level, may generally be formed by any suitable process, for example by a photolithographic etch process in which trenches are etched in a dielectric layer, such as dielectric layer 121, according to a patterned hard mask. Such processes may be single exposure patterning processes, self-aligned double patterning (SADP) processes, and so on. Via holes may also be etched through the dielectric layer 121 using similar etching processes, resulting in via holes self-aligned with metallization trenches. The trenches and via holes may then be filled with conductive material to form metallization lines 125, 125a, 125b and conductive vias 130a, 130b. In exemplary embodiments, and as depicted in FIGS. 1A and 1B, conductive vias 130a and 130b may be adjacent conductive vias having centers separated by a span D, as shown in FIG. 1A, substantially equal to a minimum critical dimension defined for the integrated circuit structure, such as a minimum pitch between metallization lines in a level. As circuits and circuit features have continued to shrink, design rules for metallization levels have frequently required that conductive vias be separated by at least twice a minimum pitch defined for a metallization level, as it may not be otherwise possible to connect the conductive vias to separate metal lines in a lower metallization level due to limitations in fabrication processes for the lower metallization level, such as processes for forming and cutting metallization lines within a metallization level. The processes disclosed and described herein advantageously permit two conductive vias to be formed adjacent one another, so that their centers are separated by the minimum critical dimension or minimum pitch, and such that each conductive via connects one metallization line of an upper metallization level (such as second metallization level 120) to a separate metallization line of a lower metallization level (such as first metallization level 110).

As depicted in the embodiment of structure 100 shown in FIG. 1A, first metallization level 110 may include a barrier liner 111 disposed below the metallization line 115. Barrier liner 111 may also be disposed on sidewalls of metallization line 115. Second metallization level 120 may have a barrier liner 126 disposed below and/or on sidewalls of metallization lines 125, 125a, 125b and conductive vias 130a, 130b. A barrier liner such as barrier liner 111 and/or barrier liner 126 may be titanium, titanium nitride, tantalum, tantalum nitride, or other barrier liner material, and may be formed, for instance, by chemical vapor deposition (CVD) or atomic layer deposition (ALD). A barrier liner may be included to prevent the metal material of metallization lines from interacting or combining with material of an underlying dielectric layer such as interlayer dielectric layer 101. Metallization line 115 may also include a conductive cap 112 over metallization line 115. Metallization lines 125, 125a, 125b as well as conductive vias 130a, 130b may also include a conductive cap 127. A conductive cap 112, 127 may be, for example, cobalt or ruthenium or other conductive material, and may be formed, for instance, by chemical vapor deposition or atomic layer deposition.

Figure 2:
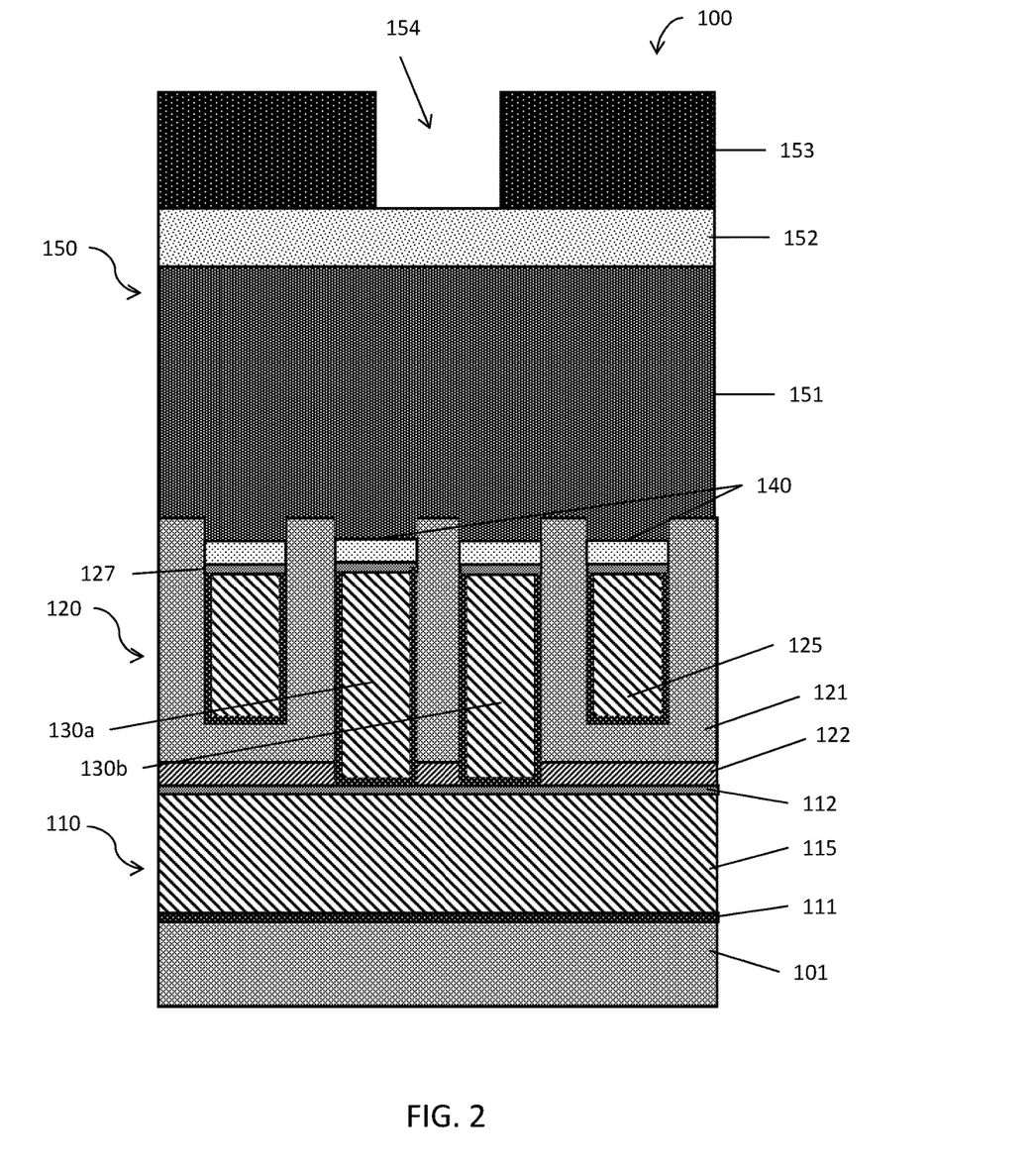

With reference to FIG. 2 in which like reference numerals refer to like features in FIGS. 1A and 1B and at a subsequent fabrication stage of the processing method, a cap 140 is selectively grown on metallization lines 125, 125a, 125b and upper surfaces of conductive vias 130a, 130b and a patterned lithography stack 150 is formed over second metallization level 120. As detailed further herein, cap 140 protects metallization lines 125a and 125b, as well as upper surfaces of conductive vias 130a and 130b, during removal of a portion of metallization line 115 in the first metallization level 110. As described further herein, cap 140 includes a material that resists etch processes that etch dielectric materials such as dielectric layer 121 or dielectric cap 122, resists etch processes for removing or "cutting" a portion of metallization line 115, and that may later be selectively removed without affecting other portions of structure 100. Cap 140 may be, for example, a conductor such as tungsten, nickel, molybdenum, or aluminum, or a semiconductor such as silicon, or a combination thereof. Cap 140 may alternatively be an insulator, such as hafnium oxide, aluminum oxide, or a combination thereof. Cap 140 may be a combination of a conductor and insulator or a combination of semiconductor and insulator, or a combination of conductor, semiconductor and insulator materials. Patterned lithography stack 150 may include, for example, an organic planarization layer (OPL) 151, an anti-reflective coating 152, and a layer of photoresist 153. The layer of photoresist 153 may be patterned with an opening 154 aligned over a portion of dielectric layer 121 to be etched, as further detailed below.

Figure 3:
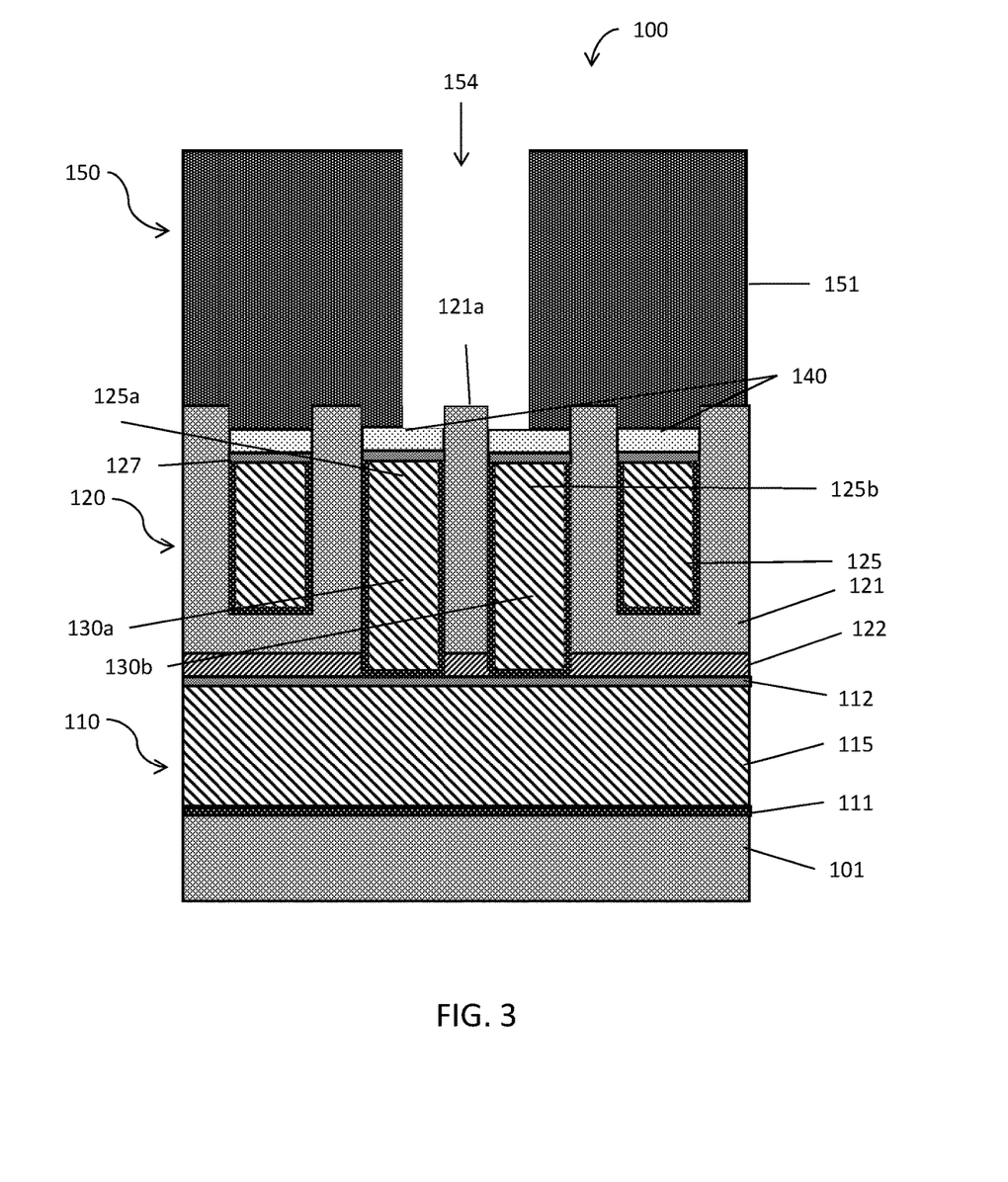

With reference to FIG. 3 in which like reference numerals refer to like features in FIG. 2 and at a subsequent fabrication stage of the processing method, the patterned lithography stack 150 is selectively etched to form an opening 154 through the patterned lithography stack 150, for example through the organic planarization layer 151, to expose the dielectric layer 121a between conductive via 130a and conductive via 130b. One or more layers of patterned lithography stack 150, such as the photoresist layer 153 and anti-reflective coating 152, may be removed following selective etching of patterned lithography stack 150.

Figure 4:
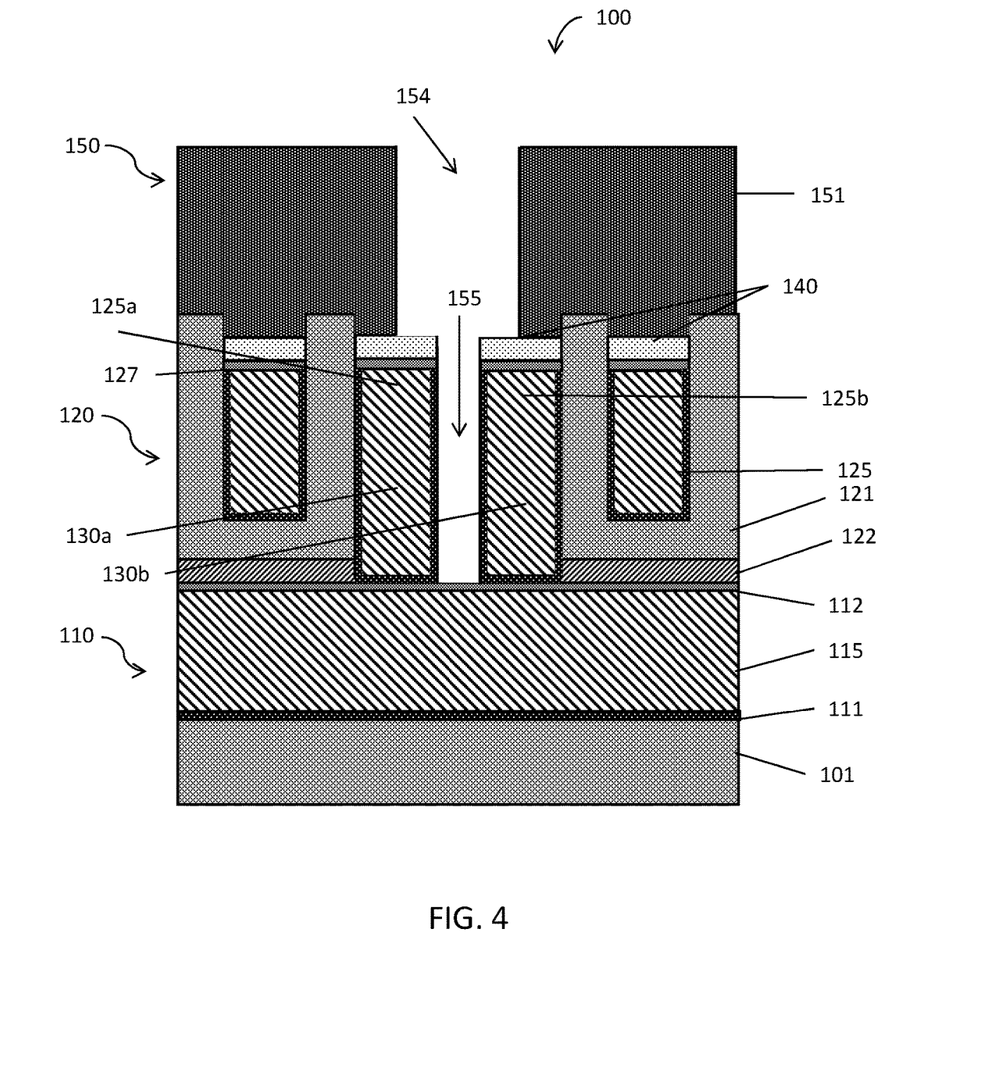

With reference to FIG. 4 in which like reference numerals refer to like features in FIG. 3 and at a subsequent fabrication stage of the processing method, a trench 155 is formed in dielectric layer 121 between conductive vias 130a and 130b, removing the portion of dielectric layer 121a exposed by opening 154, to expose a portion of metallization line 115. Trench 155 may be etched by any etch process selective to dielectric layer 121. Conductive vias 130a and 130b act to self-align the etching of trench 155, so that the exposed portion of metallization line 115 is aligned with sidewalls of conductive via 130a and conductive via 130b. In embodiments in which structure 100 includes a dielectric cap 122, the dielectric cap 122 between conductive vias 130a and 130b may be removed following etching of trench 155 in dielectric layer 121 to expose the portion of metallization line 115. Patterned lithography stack 150 may remain over second metallization level 120 to protect other portions of dielectric layer 121, as well as dielectric cap 122, from the etch process or etch processes.

Figure 5:
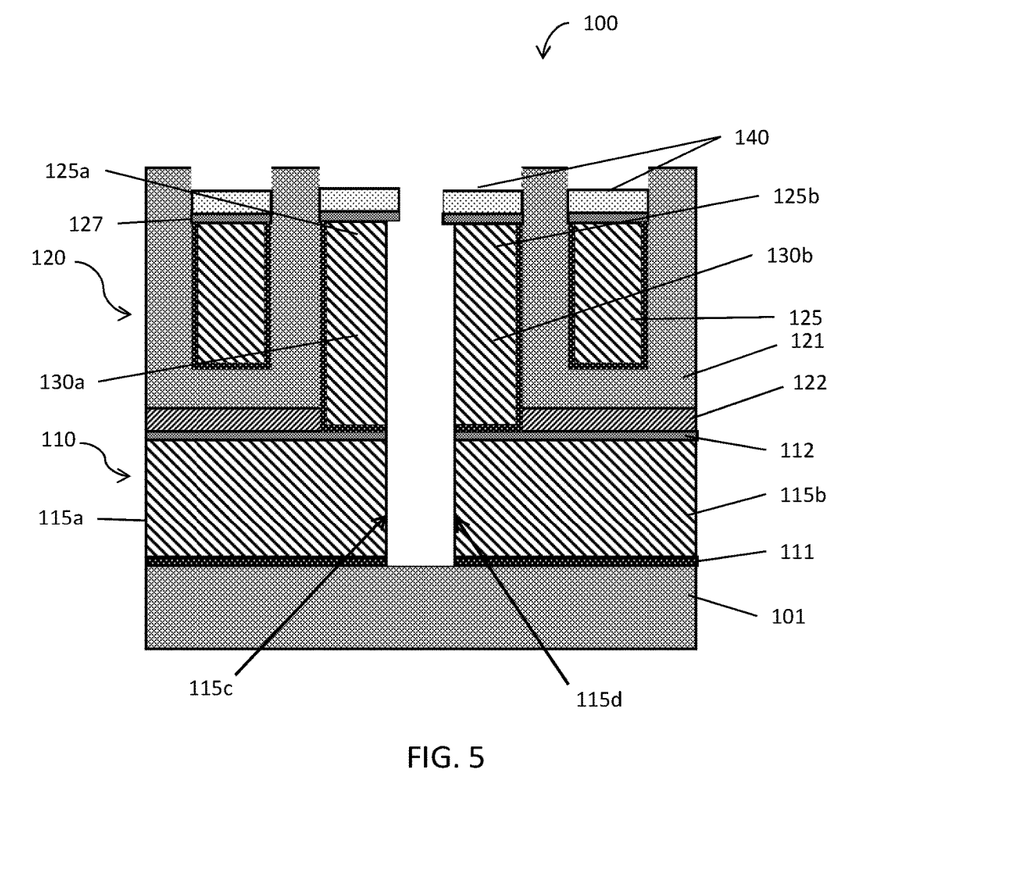

With reference to FIG. 5 in which like reference numerals refer to like features in FIG. 4 and at a subsequent fabrication stage of the processing method, a portion of metallization line 115 is removed or "cut," separating the metallization line 115 into two sections 115a, 115b disconnected from each other. Removal of the portion of metallization line 115 may be accomplished, for example, by an etching process using an etchant that selectively removes the exposed portion of metallization line 115, as well as portions of barrier liner 111 and conductive cap 112, without affecting dielectric layer 121, interlayer dielectric layer 101, or cap 140. As described above, cap 140 includes a material or materials resistant against etch processes that etch dielectric materials and is resistant against etch processes for removal of a portion of metallization line 115, so that metallization lines 125 and 125a, 125b, as well as upper surfaces of conductive vias 130a, 130b, remain intact during the etch process. Following the removal of the portion of metallization line 115, sections 115a and 115b of metallization line 115 may have exposed end surfaces 115c and 115d and, depending on the selected etchant as well as the length of exposure time to the etchant, sidewalls of conductive vias 130a and 130b may be exposed and etched back in part, as illustrated in FIG. 5.

Figure 6:
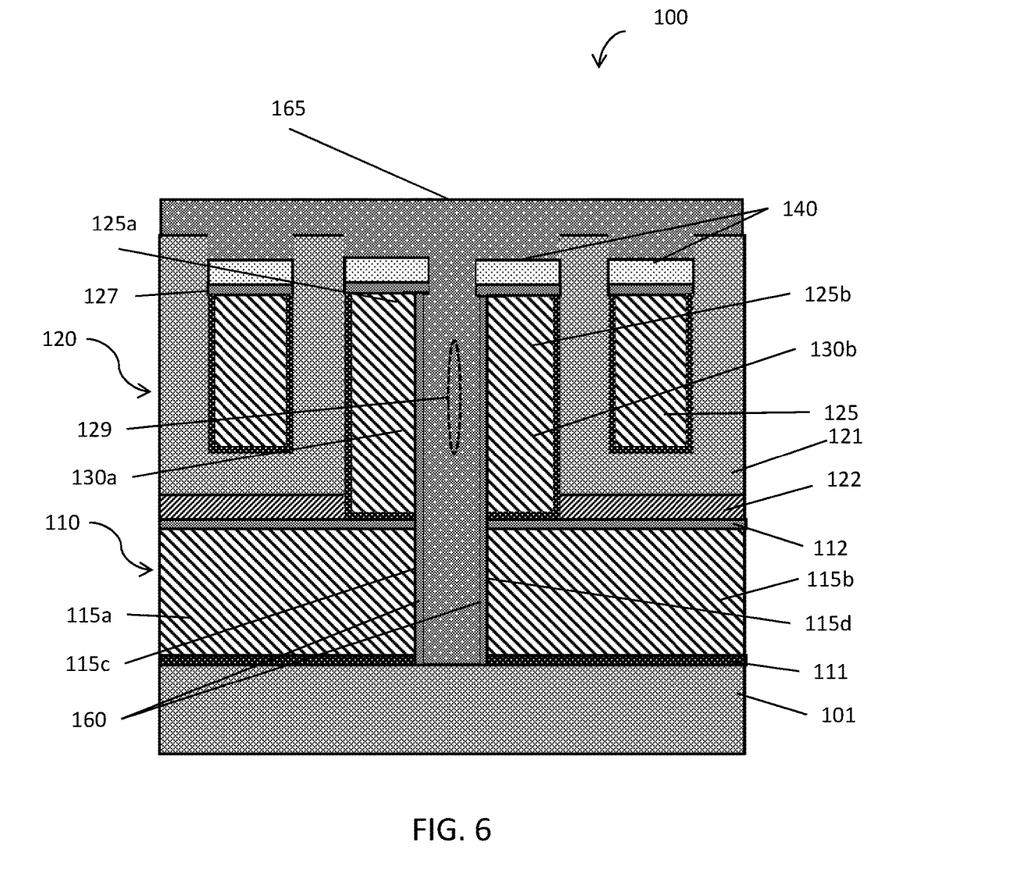

With reference to FIG. 6 in which like reference numerals refer to like features in FIG. 5 and at a subsequent fabrication stage of the processing method, a conductive barrier material 160 is selectively grown over the exposed end surface 115c of section 115a and the exposed end surface 115d of section 115b of metallization line 115, and a gapfill dielectric material 165 is deposited between the sections 115a, 115b of metallization line 115 and between conductive vias 130a, 130b. The conductive barrier material 160 may also be selectively grown over exposed sidewalls of conductive via 130a and conductive via 130b. Conductive barrier material 160 may be grown by a CVD or ALD process or other alternative process, and may be, for instance, cobalt, ruthenium, or other conductive barrier material. Conductive barrier material does not grow over or adhere to the material of cap 140. Growing conductive barrier material 160 may facilitate in partially "rebuilding" portions of conductive vias 130a and 130b that may have been removed during removal of the portion of metallization line 115, as described above. Conductive barrier material 160 may also, as described herein, prevent the metal material of sections 115a and 115b and of conductive vias 130a and 130b from interacting or combining with the gapfill dielectric material 165.

The gapfill dielectric material 165 may be a dielectric material selected to reduce or minimize capacitance between sections 115a and 115b or conductive vias 130a and 130b. As described above, conductive vias 130a and 130b may have centers separated by a span substantially equal to a minimum critical dimension defined for structure 100, and as capacitance between conductive vias is inversely proportional to the separation between the conductive vias, capacitance between conductive vias 130a and 130b may be relatively high. A gapfill dielectric material 165 with a relatively high dielectric constant k may thus be used to reduce this capacitance. For instance, the gapfill dielectric material 165 may be nitrogen-doped silicon carbide. In another example, the gapfill dielectric material 165 may be a high-k oxide material. In an embodiment, gapfill dielectric material 165 may be highly conformal such that pinch-off does not occur with the result that gapfill dielectric material 165 is solid and free of voids or airgaps. In an alternative embodiment, the gapfill may be partial, which may introduce a void or airgap 129 by pinch-off at a depth such that the airgap 129 is not opened when gapfill dielectric material 165 is recessed in a subsequent fabrication stage.

Figure 7:
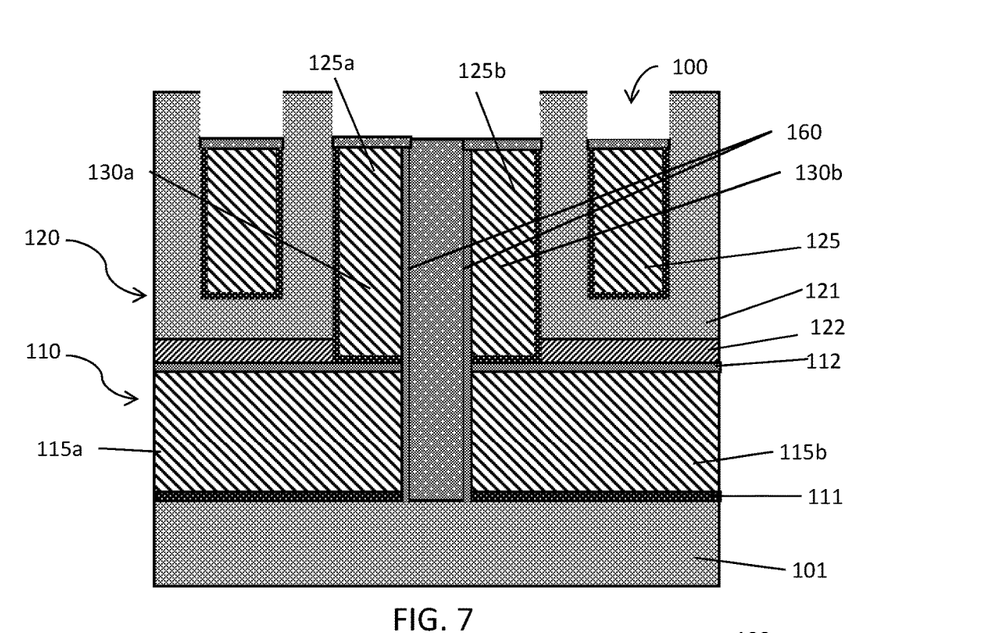

With reference to FIG. 7 in which like reference numerals refer to like features in FIG. 6 and at a subsequent fabrication stage of the processing method, gapfill dielectric material 165 is recessed and cap 140 is removed from over metallization lines 125, 125a, 125b and conductive vias 130a, 130b. Although it may be permissible in alternative embodiments to continue fabrication without removing cap 140, for example if cap 140 is a conductive material such as tungsten, generally it is advantageous to remove cap 140 so that cap 140 does not interfere with subsequent fabrication processes. Similarly, while gapfill dielectric material 165 may not be recessed in alternative embodiments, generally it is advantageous to recess gapfill dielectric material 165 so that the presence of a high dielectric constant material over second metallization layer 120 does not interfere with subsequent fabrication processes.

Figure 8:
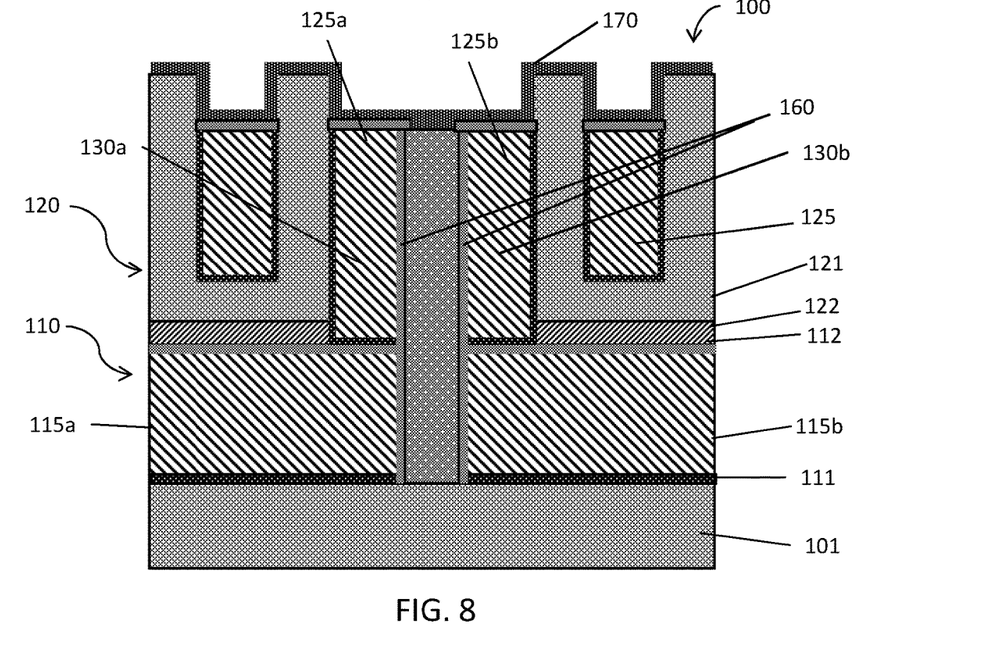

With reference to FIG. 8 in which like reference numerals refer to like features in FIG. 7 and at a subsequent fabrication stage of the processing method, a conformal dielectric cap layer 170 is deposited over second metallization layer 120. The conformal dielectric cap layer 170 may be a similar material as dielectric cap 122, such as a nitride-based dielectric material.

Figure 9:
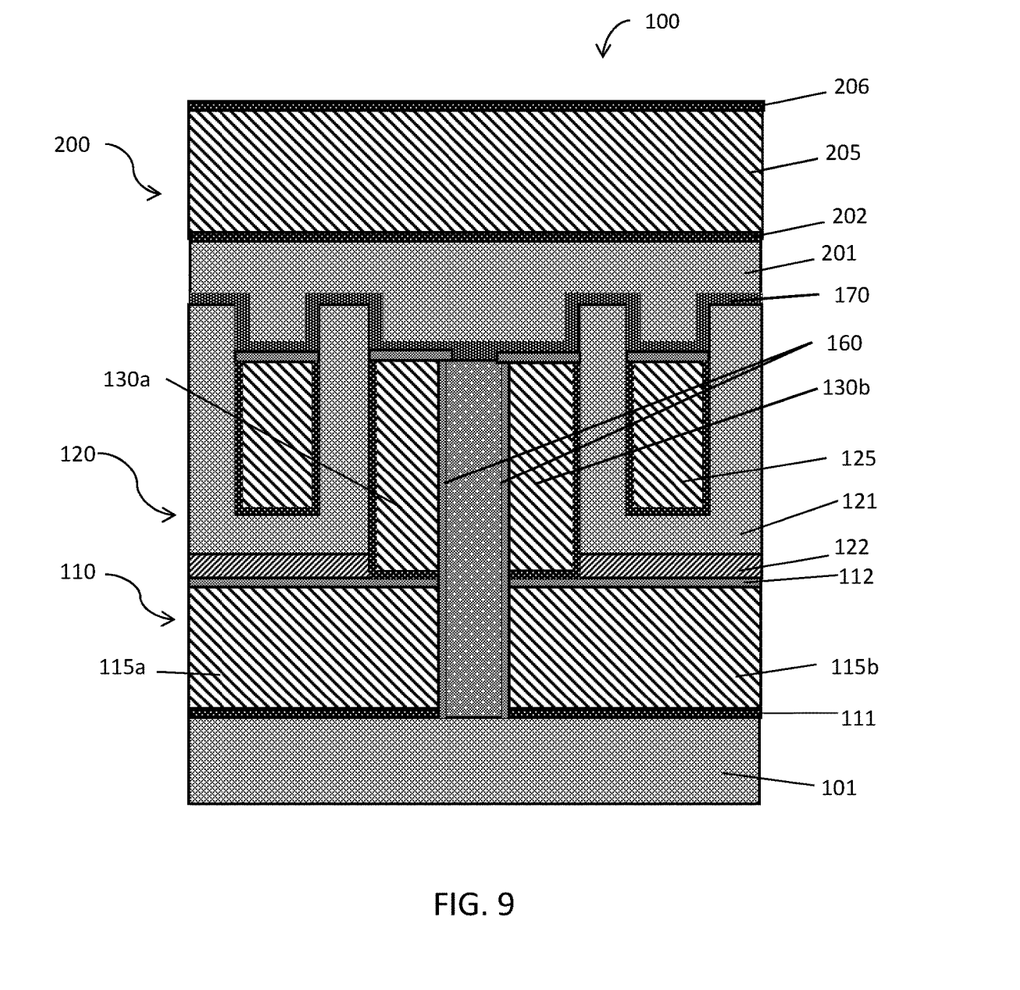

With reference to FIG. 9 in which like reference numerals refer to like features in FIG. 8 and at a subsequent fabrication stage of the processing method, a third metallization level 200 is formed over conformal dielectric cap layer 170 and second metallization level 120. Similar to first metallization level 110 or second metallization level 120, third metallization level 200 may include a metallization line or lines 205 formed in a dielectric layer 201, and metallization lines 205 may include a barrier layer 202 and conductive cap layer 206. Fabrication of third metallization level 200 may include processes as described herein or other processes for fabricating metallization levels generally for integrated circuit structures.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. In the latter case, the chip is mounted in a single chip package (e.g., a plastic carrier, with leads that are affixed to a motherboard or other higher level carrier) or in a multichip package (e.g., a ceramic carrier that has either or both surface interconnections or buried interconnections). In any case, the chip may be integrated with other chips, discrete circuit elements, and/or other signal processing devices as part of either an intermediate product or an end product.

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction perpendicular to the horizontal, as just defined. The term "lateral" refers to a direction within the horizontal plane. Terms such as "above" and "below" are used to indicate positioning of elements or structures relative to each other as opposed to relative elevation.

A feature "connected" or "coupled" to or with another element may be directly connected or coupled to the other element or, instead, one or more intervening elements may be present. A feature may be "directly connected" or "directly coupled" to another element if intervening elements are absent. A feature may be "indirectly connected" or "indirectly coupled" to another element if at least one intervening element is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method comprising:

forming a first metallization level having a first metallization line;

forming a second metallization level over the first metallization level, the second metallization level having a dielectric layer, a second metallization line, a third metallization line, a first conductive via extending from the second metallization line through the dielectric layer to the first metallization line, and a second conductive via from the third metallization line through the dielectric layer to the first metallization line;

after forming the first conductive via and the second conductive via in the second metallization level, etching a trench in the dielectric layer between the first conductive via and the second conductive via to expose a portion of the first metallization line; and removing the exposed portion of the first metallization line to separate the first metallization line into a first section and a second section disconnected from the first section,
wherein the first section of the first metallization line is connected by the first conductive via with the second metallization line, and the second section of the first metallization line is connected by the second conductive via with the third metallization line.

2. The method of claim 1 wherein, after removing the exposed portion of the first metallization line, the first section has a first end aligned with and contacting a first sidewall of the first conductive via and the second section has a second end aligned with and contacting a second sidewall of the second conductive via.

3. The method of claim 1 wherein etching the trench in the dielectric layer comprises:
forming a patterned lithography stack over the second metallization level;
selectively etching the patterned lithography stack to expose the dielectric layer between the first conductive via and the second conductive via; and
etching the exposed dielectric layer to expose the portion of the first metallization line.

4. The method of claim 3 wherein etching the exposed dielectric layer is self-aligned with the portion of the first metallization line by the first conductive via and the second conductive via.

5. The method of claim 3 further comprising:
selectively growing a cap on the second metallization line and the third metallization line,
wherein the cap protects the second metallization line and the third metallization line and upper surfaces of the first conductive via and the second conductive via during removing the exposed portion of the first metallization line.

6. The method of claim 5 wherein the cap comprises tungsten, nickel, molybdenum, silicon, aluminum, hafnium oxide, or a combination thereof.

7. The method of claim 5 wherein the first metallization level has a dielectric cap disposed over the first metallization line and below the dielectric layer of the second metallization level, the dielectric cap has a different etch selectivity from the dielectric layer and the cap, and further comprising:
removing the dielectric cap between the first conductive via and the second conductive via.

8. The method of claim 5 further comprising:
selectively growing a conductive barrier material on exposed end surfaces of the first section and the second section of the first metallization line.

9. The method of claim 8 wherein the conductive barrier material is further selectively grown over a first exposed sidewall of the first conductive via and a second exposed sidewall of the second conductive via.

10. The method of claim 8 wherein the conductive barrier material comprises cobalt or ruthenium.

11. The method of claim 5, further comprising:
depositing a gapfill dielectric material between the first section and the second section of the first metallization line and between the first conductive via and the second conductive via;
removing the cap;
depositing a conformal dielectric cap layer over the second metallization level; and,
forming a third metallization level over the conformal dielectric cap layer.

12. The method of claim 11 wherein the gapfill dielectric material comprises nitrogen-doped silicon carbide or a high-k oxide material.

13. The method of claim 11 wherein the gapfill dielectric material includes an airgap.

14. A structure comprising:
a first metallization level of an integrated circuit structure, the first metallization level having a first metallization line separated into a first section and a second section disconnected from the first section;
a second metallization level over the first metallization level, the second metallization level having a dielectric layer, a second metallization line, a third metallization line, a first conductive via extending from the second metallization line through the dielectric layer to the first section of the first metallization line, and a second conductive via extending from the third metallization line through the dielectric layer to the second section of the first metallization line; and
a gapfill dielectric material disposed between the first section and the second section of the first metallization line and between the first conductive via and the second conductive via,
wherein the gapfill dielectric material is nitrogen-doped silicon carbide or a high-k oxide material, the first section has a first end surface aligned with and contacting a first bottom surface of the first conductive via, and the second section has a second end surface aligned with and contacting a second bottom surface of the second conductive via.

15. The structure of claim 14 wherein a first center of the first conductive via and a second center of the second conductive via are separated by a span substantially equal to a minimum critical dimension of the integrated circuit structure.

16. The structure of claim 14 wherein the gapfill dielectric material includes an airgap.

17. The structure of claim 14 further comprising:
a conductive barrier material disposed over the first end surface of the first section of the first metallization line, the second end surface of the second section of the first metallization line, the first sidewall of the first conductive via, and the second sidewall of the second conductive via,
wherein the conductive barrier material comprises cobalt or ruthenium.

* * * * *